(12) United States Patent
Buhr

(10) Patent No.: US 6,928,510 B2
(45) Date of Patent: Aug. 9, 2005

(54) METHOD AND ARRANGEMENT FOR PROGRAMMING AND VERIFYING EEPROM PAGES AND A CORRESPONDING COMPUTER SOFTWARE PRODUCT AND A CORRESPONDING COMPUTER-READABLE STORAGE MEDIUM

(75) Inventor: Wolfgang Buhr, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 278 days.

(21) Appl. No.: 10/324,768

(22) Filed: Dec. 20, 2002

(65) Prior Publication Data

US 2003/0131186 A1 Jul. 10, 2003

(30) Foreign Application Priority Data

Dec. 29, 2001 (DE) .......................................... 101 64 415

(51) Int. Cl.[7] .............................................. G06F 12/00
(52) U.S. Cl. ........................ 711/103; 711/154; 712/37; 714/25; 714/718; 365/185.33; 365/201
(58) Field of Search ............................. 714/48, 718, 25; 365/201, 185.01, 185.22, 185.29, 185.33; 711/103, 154; 712/37

(56) References Cited

U.S. PATENT DOCUMENTS

| | | | | |
|---|---|---|---|---|
| 4,794,558 A | * | 12/1988 | Thompson ................... | 712/37 |
| 5,333,292 A | * | 7/1994 | Takemoto et al. .......... | 711/103 |
| 5,390,148 A | * | 2/1995 | Saito ...................... | 365/185.08 |
| 5,734,321 A | * | 3/1998 | Takahashi ................... | 340/505 |
| 5,745,425 A | * | 4/1998 | Anderson et al. ........... | 365/226 |
| 5,748,535 A | * | 5/1998 | Lin et al. ................ | 365/185.22 |
| 5,778,440 A | | 7/1998 | Yiu et al. .................... | 711/154 |
| 5,802,268 A | * | 9/1998 | Fisher et al. .................. | 714/25 |
| 5,991,517 A | * | 11/1999 | Harari et al. .................. | 714/3 |
| 6,335,881 B2 | * | 1/2002 | Kim et al. ............. | 365/185.18 |

FOREIGN PATENT DOCUMENTS

DE 4344379 6/1995 ............ G11C/7/00

* cited by examiner

*Primary Examiner*—Nasser Moazzami
(74) *Attorney, Agent, or Firm*—Kevin Simons

(57) ABSTRACT

The invention relates to a method and arrangement for programming and verifying EEPROM pages and a corresponding computer software product and a corresponding computer-readable storage medium, which can be used in particular to speed up the programming into the EEPROM of large amounts of data or code, such as occurs for example when smart cards are being personalized.

Figure 1:
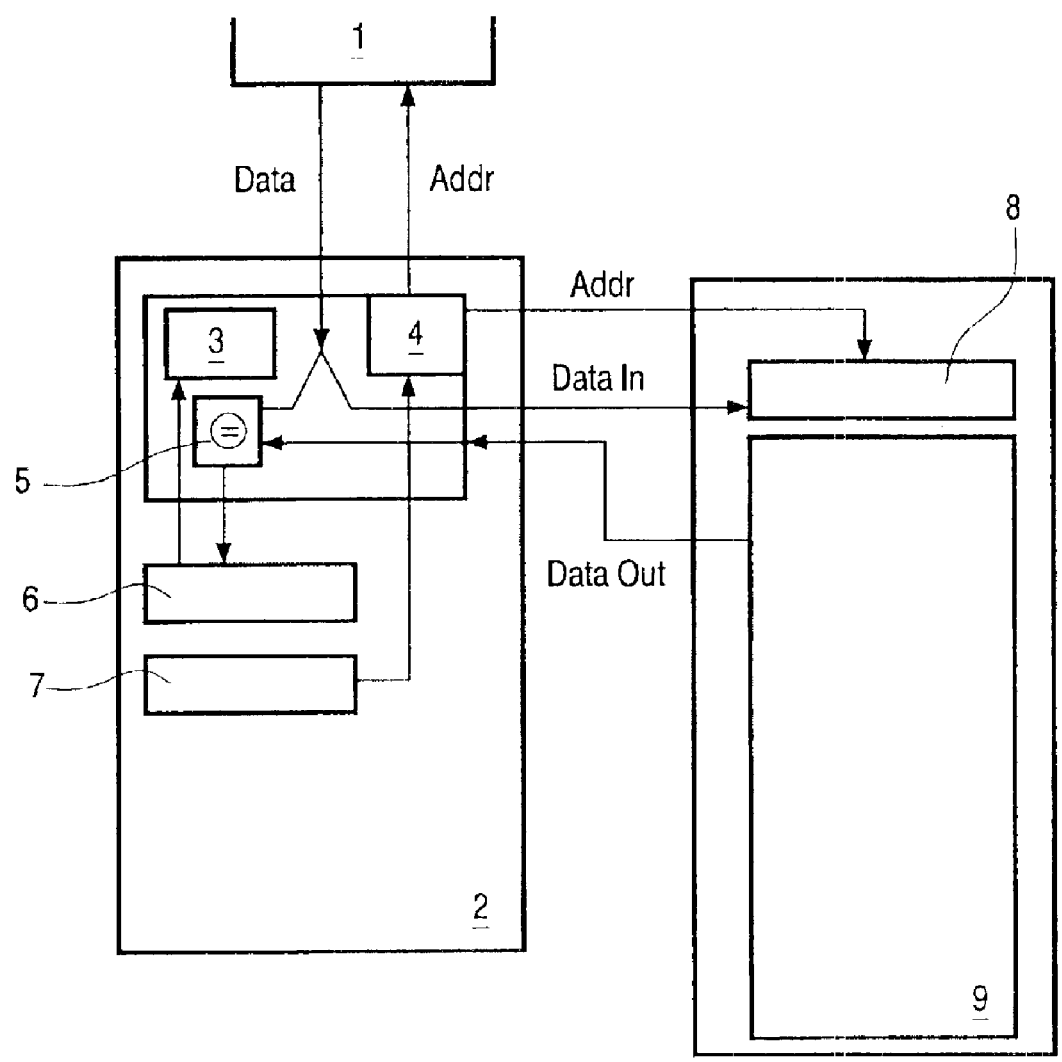

The invention relates to an arrangement that sets up a DMA connection between EEPROM and RAM—not including the core of the microcontroller involved—and makes possible automatic programming of data blocks of random length from the RAM to the EEPROM including the verification of the programming operation against the original data in the RAM under the control of the EEPROM logic.

13 Claims, 1 Drawing Sheet

METHOD AND ARRANGEMENT FOR PROGRAMMING AND VERIFYING EEPROM PAGES AND A CORRESPONDING COMPUTER SOFTWARE PRODUCT AND A CORRESPONDING COMPUTER-READABLE STORAGE MEDIUM

The invention relates to a method and an arrangement for programming and verifying EEPROM pages and to a corresponding computer software product and to a corresponding computer-readable storage medium, which can be used in particular to speed up the programming into the EEPROM of large amounts of data or code, such as occurs for example when smart cards are being personalized.

The development of microelectronics in the seventies made it possible for miniature computers of credit card format with no user interface to be produced. Computers of this kind are referred to as smart cards. In a smart card, a data memory and an arithmetic and logic unit are integrated into a single chip measuring a few square millimeters in size. Smart cards are used in particular as telephone cards and GSM SIM cards and in the banking field and in health care. The smart card has thus become a computing platform that we see wherever we turn.

Smart cards are currently regarded primarily as a safe and secure place for holding secret data and as a safe and secure platform for running cryptographic algorithms. The reason why the data and algorithms on the card are assumed to enjoy relatively high safety and security lies in the hardware construction of the card and in the interfaces that are run to the exterior. From the outside the card looks like a "black box", whose functions can only be accessed via a well-defined hardware and software interface and which can compel the observance of certain security policies. On the one hand, access to data can be linked to certain conditions. Access from outside to critical data, such as secret keys in a public key process for example, may even be totally barred. On the other hand a smart card is capable of running algorithms without it being possible for the execution of the individual operations to be observed from outside. The algorithms themselves may be protected on the card against being altered or read out. In an object-orientated sense, the smart card can be thought of as a type of abstract data that has a well-defined interface, that behaves in a specified way and that is itself capable of ensuring that certain integrity conditions are observed with regard to its state.

Essentially, there are two different types of smart card. Memory cards have simply a serial interface, addressing and security logic and ROM and EEPROM memories. Such cards perform only limited functions and are used for a specific application. This is why they are particularly cheap to produce. Smart cards produced in the form of microprocessor cards constitute, in principle, a complete general-purpose computer.

The process of manufacturing and supplying chip cards can be divided into the following phases:
  production of the chip,
  embedding of the chip,
  printing of the card
  personalization of the card
  issue of the card.

Each phase of the process is generally carried out by a company specializing in the particular operation. When the chips are being produced, care must be taken to ensure good security within the firm, particularly when the cards involved have hard-wired security logic. To enable the manufacturer to carry out a proper final test, the entire memory has to be freely accessible. Only after the final test is the chip made secure by means of a transport code. Thereafter, access to the card memory is possible only for authorized bodies that know the transport code. Hence there is no point in stealing brand-new chips. The authorized bodies may be card personalizers or issuers. No further making-secure functions are required for the embedding and printing operations. There is no need for the firms involved to know the transport code.

It is generally not the card manufacturer but the issuing body (e.g. a bank, telephone company, private or public health-care scheme) that puts the personal data into the card. This process is known as personalization and to perform it it is necessary to know the transport code.

The issue of the card, i.e. its movement from the issuing body to the cardholder, poses another security problem. To be exact, it is only the issue of the card to the card holder in person in return for a signature and production of an identity card or other personal identification that is secure. It is true that sending out by post is often cheaper, but it is also not very secure. Another problem is notifying the cardholder of the PIN number, in which case the same care has to be taken as with the card.

Because of the potentially dangerous security-related information held in the memories present in smart card controllers, not only do the above safeguarding steps have to be taken but additional protection also needs to be provided against the possible activities of hackers, which may cover every phase of the life of a smart card beginning with the manufacture of the card and extending through its transport and use to the manipulation of cards that have become unusable.

When large amounts of data/code are being programmed into the EEPROM (such as in the course of personalization for example), a relatively large amount of time is wasted on the one hand by the transmission of the data via an SFR bus and on the other by verification that is needed, after the programming of each page, of the data that has been written to the EPPROM.

Hitherto, it was necessary, when personalizing the EEPROM for example, for the individual steps (read-out of the RAM, writing of the page to the EEPROM page register, another read-out, this time of the programmed bytes from the EEPROM, and comparison with the desired values from the RAM) to be performed by software means, which meant that a considerable proportion of the time taken to write to the page register and to verify the programmed page was needed for bus transfers and register instructions.

Where it is large areas of a memory that are written to, as is the case for example when an EEPROM is being personalized with user code, it is found to be a disadvantage that, to the time taken to program each page of the EEPROM, which is considerable anyway, there is added the additional time needed for loading the page register and verifying the page programmed.

There are various known methods for transferring data between EEPROM's, ROM's and RAM's.

Disclosed in U.S. Pat. No. 5,802,268 is an arrangement that performs data access to a controller having ROM, RAM and EEPROM memories linked to it.

U.S. Pat. No. 5,778,440 describes an arrangement for verifying data programmed into an EEPROM. It relates solely to the control logic of the EEPROM memory itself and thus only to the components of the memory formed by its page register, memory matrix and programming/verification logic. It is thus a description purely of verifying logic for the EEPROM but not of a special method of transmitting data that, in particular, also involves the RAM.

German patent DE 43 44 379 A1 relates to a method of programming an EPROM module arranged in a microprocessor circuit, part of the storage capacity of which module is used as program storage for a microprocessor that is connected to the EEPROM module by a bus line, the free storage capacity of the EPROM module being taken up by data transmitted from the microprocessor directly to the EPROM module and the transmission of data along the address and data bus being frozen during the whole of the programming operation by stopping the timing to the microprocessor.

Hence, what is presented here is simply an arrangement for programming an EEPROM in a controller architecture.

It is an object of the invention to specify a method, an arrangement and a corresponding computer software product and a corresponding computer-readable storage medium, of the generic type, by which the disadvantages of the conventional procedures are overcome and by which it becomes possible for data to be written from the RAM to the page register of the EEPROM, and to be automatically verified after the programming operation, in as short a time as possible. At the same time, the hardware required at the EEPROM interface is to be minimal.

In accordance with the invention, this object is achieved by means of a collaborative association of the features in the characterizing clauses of claims 1, 10, 12 and 13 with the features in the preambles. Advantageous embodiments of the invention are detailed in the subclaims.

A particular advantage of the method of programming and verifying EEPROM pages is that in a first step data words of a preset length are read from the RAM and written to the page register, in a second step the programming operation for these data words is carried out, and in a third step the data words are again read from the RAM and the programmed data words are read from the EEPROM and verified, with steps one to three being repeated until such time as the programming of the EEPROM has been completed.

An arrangement for programming and verifying EEPROM pages is advantageously set up so that it comprises a processor that is set up in such a way that programming and verification of EEPROM pages can be performed by, in a first step, reading data words of a preset length from the RAM and writing them to the page register, in a second step, carrying out the programming operation for these data words, and, in a third step, again reading the data words from the RAM and reading the programmed data words from the EEPROM and verifying them, with steps one to three being repeated until such time as the programming of the EEPROM has been completed.

A computer software product for programming and verifying EEPROM pages comprises a computer-readable storage medium on which is stored a program that, once it has been loaded into the memory of the computer or the smart-card controller, makes it possible for the programming and verification of EEPROM pages to be performed by, in a first step, reading data words of a preset length from the RAM and writing them to the page register, in a second step, carrying out the programming operation for these data words, and, in a third step, again reading the data words from the RAM and reading the programmed data words from the EEPROM and verifying them, with steps one to three being repeated until such time as the programming of the EEPROM has been completed.

To perform the programming and verification of EEPROM pages, use is advantageously made of a computer-readable storage medium on which is stored a program that, once it has been loaded into the memory of the computer or the smart-card controller, makes it possible for the programming and verification of EEPROM pages to be performed by, in a first step, reading data words of a preset length from the RAM and writing them to the page register, in a second step, carrying out the programming operation for these data words, and, in a third step, again reading the data words from the RAM and reading the programmed data words from the EEPROM and verifying them, with steps one to three being repeated until such time as the programming of the EEPROM has been completed. It is particularly advantageous in this case for the programming and verification unit circuit arrangement (PVU) to perform this programming/verification function as a hardware function and for it thus to replace parts of the program that would otherwise be needed.

In the method according to the invention, the EEPROM interface is advantageously given direct memory access to the RAM, the address control register and the data-word-length register during the cycles of the programming and verification operation.

It has proved advantageous for RAM address data to be loaded into the start address SFR 7 of the PVU before the cycles of the programming and verification operation begin and for the programming and verification sequence to be started by a report to the control/status SFR of the PVU.

In a preferred embodiment of the method according to the invention, provision is made for the start address of the data word in the RAM that is to be read in the first step to be defined by the SFR of the programming and verification unit. Another advantageous embodiment of the method according to the invention is one in which the start address of the data word to be programmed in the EEPROM in the second step is defined by EADRX SFRs. In the method of programming and verifying EEPROM pages, it has proved advantageous for the preset length of the data word to be read in the first step to be defined by the control/status SFR 6 of the PVU. It has also been found advantageous for the verification of the programmed data words to be performed by the control/status SFR of the PVU.

A further advantage of the method according to the invention is that the verification of the programmed data words takes place word by word. It has also been found advantageous for the RAM interface to have priority logic that checks and if necessary delays or refuses CPU access to the RAM during the cycles of the programming and verification operation.

As well as this, provision is made in a preferred embodiment of the method according to the invention for the processor to be part of a smart-card controller and for the arrangement to be a smart card.

The invention covers an arrangement that incorporates the data memory (RAM) from which the page register of the EEPROM is loaded as part of the arrangement, for which purpose a DMA (direct memory access) connection under the control of the EEPROM logic is introduced as an essential part of the invention between the RAM and the EEPROM and thus enables even quite large data blocks from the RAM that many times exceed the storage capacity of the EEPROM page register to be programmed and verified under the control of the EEPROM logic. Hence in functional terms the invention goes beyond the methods practiced in the past.

The invention provides an arrangement that sets up a DMA connection between EEPROM and RAM—not including the core of the microcontroller involved—and makes possible automatic programming of data blocks of random length from the RAM to the EEPROM including the verification of the programming operation against the original data in the RAM under the control of the EEPROM logic.

Compared with the personalizing function which existed hitherto, this method has a major advantage in terms of speed because the maximum read/write rate is dependent only on the access timing of the EEPROM. There are no additional delays caused by SFR bus handshakes or compare commands.

The verification of the programmed bytes by reading the RAM area twice avoids the need for the page register to be duplicated at the EEPROM interface and thus minimizes the amount of hardware required.

These and other aspects of the invention are apparent from and will be elucidated with reference to an embodiment described hereinafter and from and with reference to the accompanying drawing, which shows an EEPROM programming and verification unit (PVU).

To perform the programming and verification operation, an EEPROM interface 2 is given DMA (direct memory access) to a RAM 1 and to two additional control registers that give the basic address Baddr in the RAM 1 and the length PagLen (maximum length of a page register 8) of the data area to be programmed.

The page program and verify unit (FSM) at the EEPROM interface 2 controls the running of the page programming in three phases:

Phase 1: Reading of PagLen data words from RAM 1 and writing of these words to page register 8. The page address in the EEPROM is determined in this case by the SFR's EADR2 . . . 0.

Phase 2: Start of programming operation.

Phase 3: Renewed read-out of the same data words from RAM 1, simultaneous read out of the programmed words from the EEPROM, and verification of the programmed data word by word.

The RAM interface must be given priority logic that slows down or forbids CPU access to RAM 1 during the EEPROM program and verify cycles.

Before the programming and verification operation begins, the start address SFRs of the PVU are loaded with the RAM address data, and the programming and verification operation is started by a report to the control/status SFR 6 of the PVU.

The invention is not limited to the embodiments shown and described here. By combining and modifying the means and features mentioned it is in fact possible to produce other variant embodiments without thereby exceeding the scope of the invention.

| List of reference numerals |
| --- |
| 1  RAM |
| 2  EEPROM interface |
| 3  CNTRL |
| 4  Address generator |
| 5  RAM/EEPROM data comparator |
| 6  Control/status SFR of programming and verification unit (PVU) |
| 7  RAM start address pointer SFR of PVU |
| 8  (128 byte) Page register |
| 9  EEPROM matrix |

What is claimed is:

1. A method of programming and verifying EEPROM pages, characterized in that in a first step data words of a preset length are read from the RAM and written to the page register, in a second step the programming operation for these data words is carried out, and in a third step the data words are again read from the RAM and the programmed data words are read from an EEPROM and verified, with steps one to three being repeated until such time as the programming of the EEPROM has been completed;

wherein an EEPROM interface, coupled between the EEPROM and a RAM, is given direct memory access to the RAM, an address control register and a data-word-length register during cycles of the programming and verification operation.

2. A method as claimed in claim 1, characterized in that RAM address data is loaded into a start address special function register (SFR) of a programming and verification unit (PVU) before the cycles of the programming and verification operation begin, and the programming and verification sequence is started by a report to the control/status SFR of the PVU.

3. A method as claimed in claim 1, characterized in that the start address of the data word in the RAM that is to be read in the first step is defined by the SFR of the programming and verification unit.

4. A method as claimed in claim 1, characterized in that the start address of the data word to be programmed in the EEPROM in the second step is defined by predetermined special function registers.

5. A method as claimed in claim 1, characterized in that the preset length of the data word to be read in the first step is define by the control/status SFR of the PVU.

6. A method as claimed in claim 1, characterized in that the verification of the programmed data words is performed by the control/status SFR of the PVU.

7. A method as claimed in claim 1, characterized in that the verification of the programmed data words takes place word by word.

8. A method as claimed in claim 1, characterized in that the RAM interface has priority logic that checks and if necessary delays or refuses CPU access to the RAM during the cycles of the programming and verification operation.

9. An arrangement having a processor that is set up in such a way that programming and verification of EEPROM pages can be performed by, in a first step, reading data words of a preset length from a RAM and writing them to a page register, in a second step, carrying out the programming operation for these data words, and, in a third step, again reading the data words from the RAM and reading the programmed data words from an EEPROM and verifying them, with steps one to three being repeated until such time as the programming of the EEPROM has been completed;

wherein an EEPROM interface, coupled between the EEPROM and a RAM, is given direct memory access to the RAM, an address control register and a data-word-length register during cycles of the programming and verification operation.

10. An arrangement having a processor, as claimed in claim 9, characterized in that the processor is part of a smart-card controller and the arrangement is a smart-card.

11. A computer software product that comprises a computer-readable storage medium on which is stored a program that, once it has been loaded into the memory of the computer or the smart-card controller, makes it possible for programming and verification of EEPROM pages to be performed by, in a first step, reading data words of a present length from a RAM and writing them to a page register, in a second step, carrying out the programming operation for these data words, and, in a third step again reading the data words from the RAM and reading the programmed data words from an EEPROM and verifying them, with steps one to three being repeated until such time as the programming of the EEPROM has been completed;

wherein an EEPROM interface, coupled between the EEPROM and a RAM, is given direct memory access to the RAM, an address control register and a data-word-length during cycles of the programming and verification operation.

12. A computer-readable storage medium on which is stored a program that, once it has been loaded into the memory of the computer or the smart-card controller, makes it possible for the programming and verification of EEPROM pages to be performed by, in a first step, reading data words of a preset length from a RAM and writing them to a page register, in a second step, carrying out the programming operation for these data words, and, in a third step again reading the data words from the RAM and reading the programmed data words from an EEPROM and verifying them, with steps one to three being repeated until such time as the programming of the EEPROM has been completed;

wherein an EEPROM interface, coupled between the EEPROM and a RAM, is given direct memory access to the RAM, an address control register and a data-word-length register during cycles of the programming and verification operation.

13. The method of claim 1, wherein the EEPROM interface is disposed within a microcontroller.

* * * * *